United States Patent [19]

Seetharaman et al.

[11] Patent Number: 5,665,180
[45] Date of Patent: Sep. 9, 1997

[54] METHOD FOR HOT ROLLING SINGLE CRYSTAL NICKEL BASE SUPERALLOYS

[75] Inventors: Venkat K. Seetharaman, Beavercreek; Sheldon L. Semiatin, Dayton; Carl A. Lombard, Beavercreek, all of Ohio

[73] Assignee: The United States of America as represented by the Secretary of the Air Force, Washington, D.C.

[21] Appl. No.: 499,723

[22] Filed: Jun. 7, 1995

[51] Int. Cl.$^6$ ............................................. C22F 1/10
[52] U.S. Cl. ........................ 148/527; 148/537; 148/562; 148/677
[58] Field of Search ............................ 148/522, 527, 148/537, 562, 676, 677

[56] References Cited

U.S. PATENT DOCUMENTS

| | | | |
|---|---|---|---|
| 3,147,155 | 9/1964 | Lamb | 148/677 |
| 3,785,877 | 1/1974 | Bailey | 148/677 |
| 4,385,939 | 5/1983 | Kortovich et al. | 148/562 |
| 4,512,817 | 4/1985 | Duhl et al. | 148/562 |
| 4,529,452 | 7/1985 | Walker | 148/527 |
| 5,100,484 | 3/1992 | Wokusick et al. | 148/562 |

FOREIGN PATENT DOCUMENTS 94-13849  6/1994  WIPO ................... 148/677

*Primary Examiner*—George Wyszomierski
*Attorney, Agent, or Firm*—Bobby D. Scearce; Thomas L. Kundert

[57] ABSTRACT

A heat treatment and hot working method for producing a thin sheet of nickel base superalloy single crystals is described, wherein a single crystal preform of an alloy is first heat treated in vacuum at temperatures below the $\gamma'$ solvus temperature of the alloy in order to obtain an overaged $\gamma'$ microstructure in the preform, sized and surface ground in order to remove surface defects, and then preferably surrounded by plates and interlayers of refractory metal or alloy and parting agent coatings; the plates are then welded to form an enclosure and evacuated, preheated and soaked at 1093° to 1150° C. and rolled at roll speeds of about 0.12 to 0.25 rods in successive passes, at about 5 to 15% reduction per pass with reheating at the soaking temperature between successive passes, to a reduction in thickness of 50 to 75%; the plates are then removed and the preform is conditioned, repacked and successively rolled to preselected thickness.

6 Claims, 3 Drawing Sheets

METHOD FOR HOT ROLLING SINGLE CRYSTAL NICKEL BASE SUPERALLOYS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to methods for heat treating and deformation processing of metals and alloys, and more particularly to a method for producing thin sheets of a single crystal superalloy by conditioning the cast alloy microstructure, pack rolling the alloy and post-rolling heat treatment.

Thin sheets of commercial nickel base superalloys have been used in critical components of advanced propulsion systems. These components demand high stiffness, tensile and creep strength and high cycle fatigue properties at temperatures up to 1800° F. Commercial nickel base superalloys and oxide-dispersion strengthened alloys are quite satisfactory at low and intermediate temperatures, but are generally inadequate for prolonged use at high service temperatures. The invention solves or substantially reduces in critical importance shortcomings in the prior art by providing a method for producing single crystal superalloys in thin sheet form for use in fabricating components for high temperature applications. Directionally solidified single crystal superalloys of improved compositions exhibit high tensile and creep strength, crack growth resistance and fatigue resistance at the high operating temperatures of gas turbine engines. In accordance with the method described herein, thick cast sections of an alloy are repeatedly hot worked to thin sheet form without the occurrence of dynamic or static recrystallization in the alloy. The process is applicable generally to a wide range of nickel base superalloys for producing single crystal sheets and for controlling the extent of recrystallization in polycrystalline alloys. The principles of the invention may also be applied to the production of rods, wires or other special cross-section geometries It is therefore a principal object of the invention to provide a heat treatment and hot deformation method for metals and alloys.

It is a further object of the invention to provide a method for heat treatment of nickel base superalloys.

It is yet another object of the invention to provide a method for producing thin single crystal sheets of nickel base superalloys.

It is a further object of the invention to produce thin sheets of nickel base superalloys having good high temperature tensile strength and creep and crack resistance.

It is yet another object of the invention to provide a method for controlling recrystallization in polycrystalline nickel base superalloys during hot working.

These and other objects of the invention will become apparent as a detailed description of representative embodiments proceeds.

SUMMARY OF THE INVENTION

In accordance with the foregoing principles and objects of the invention, a heat treatment and hot working method for producing a thin sheet of nickel base superalloy single crystals is described, wherein a single crystal preform of an alloy is first heat treated in vacuum at temperatures below the plates and interlayers of refractory metal or alloy and parting agent coatings; the plates are then welded to form an enclosure and evacuated, preheated and soaked at 1093° to 1150° C. and rolled at roll speeds of about 0.12 to 0.25 m/s in successive passes, at about 5 to 15% reduction per pass with reheating at the soaking temperature between successive passes, to a reduction in thickness of 50 to 75%; the plates are then removed and the preform is conditioned, repacked and successively rolled to preselected thickness.

DESCRIPTION OF THE DRAWINGS

The invention will be more clearly understood from the following detailed description of representative embodiments thereof read in conjunction with the accompanying drawings wherein.

DETAILED DESCRIPTION

Figure 1:
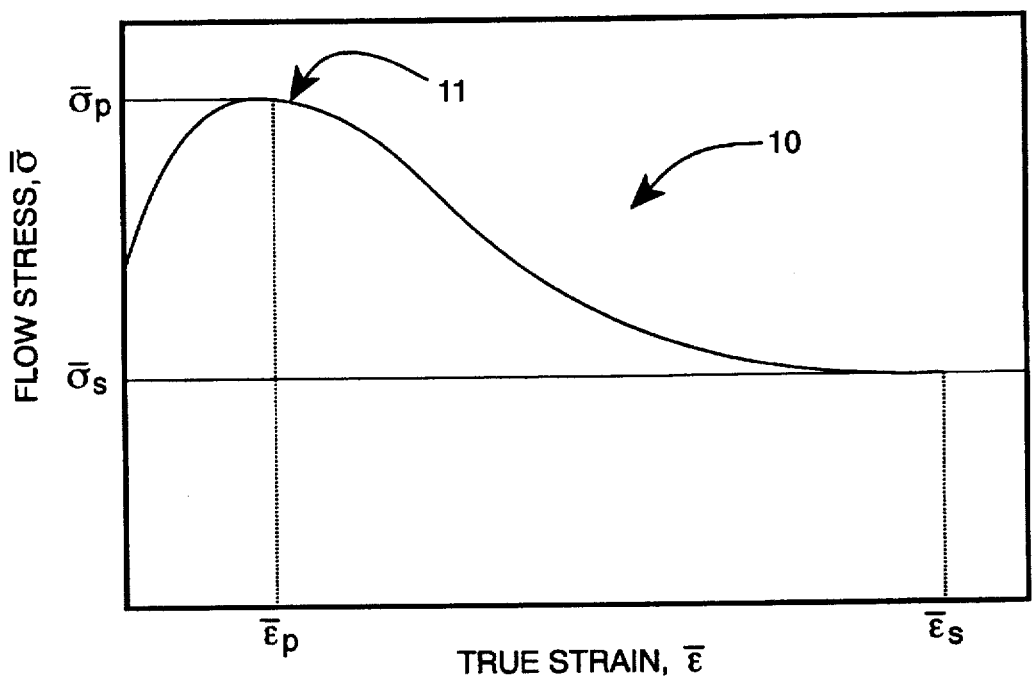
FIG. 1 is a graph of flow stress versus true strain showing qualitatively the flow curve for a material which dynamically recrystallizes during hot working.

In accordance with a principal feature of the invention, a method is described for hot rolling single crystal nickel base superalloys resulting in substantial thickness reduction without the occurrence of static or dynamic recrystallization in the alloy or cracking in the fully rolled alloy. Dynamic recrystallization can occur during a rolling pass of the reduction per pass exceeds a critical strain, the magnitude of which depends on the rolling speed and temperature. FIG. 1 illustrates qualitatively a typical flow curve 10 defined on a graph of flow stress $\bar{\sigma}$ versus true strain $\bar{\epsilon}$ for a nickel base superalloy which dynamically recrystallizes during hot working. The deformation resistance (flow stress) initially increases with deformation, passes through a broad peak 11 at a maximum at $\bar{\epsilon}_p$, and then exhibits flow softening or decreasing flow stress at high strain. Peak strain $\bar{\epsilon}_p$ is related to critical strain $\bar{\epsilon}_c$ at which dynamic recrystallization commences as $\bar{\epsilon}_c = 0.83 \bar{\epsilon}_p$. At sufficiently high strain $\bar{\epsilon}_s$, substantially constant (steady state) flow is reached. $\bar{\epsilon}_c$ generally increases with increased strain rate and decreased temperature. In accordance with a governing principle of the invention, occurrence of dynamic recrystallization during rolling can be avoided by selecting temperatures and strain rates such that the strain corresponding to each pass does not exceed $\bar{\epsilon}_c$. Static recrystallization may also occur during reheating between successive rolling passes. This can, however, be precluded by controlling the cumulative strain during rolling and the interpass reheating schedule.

Figure 2:
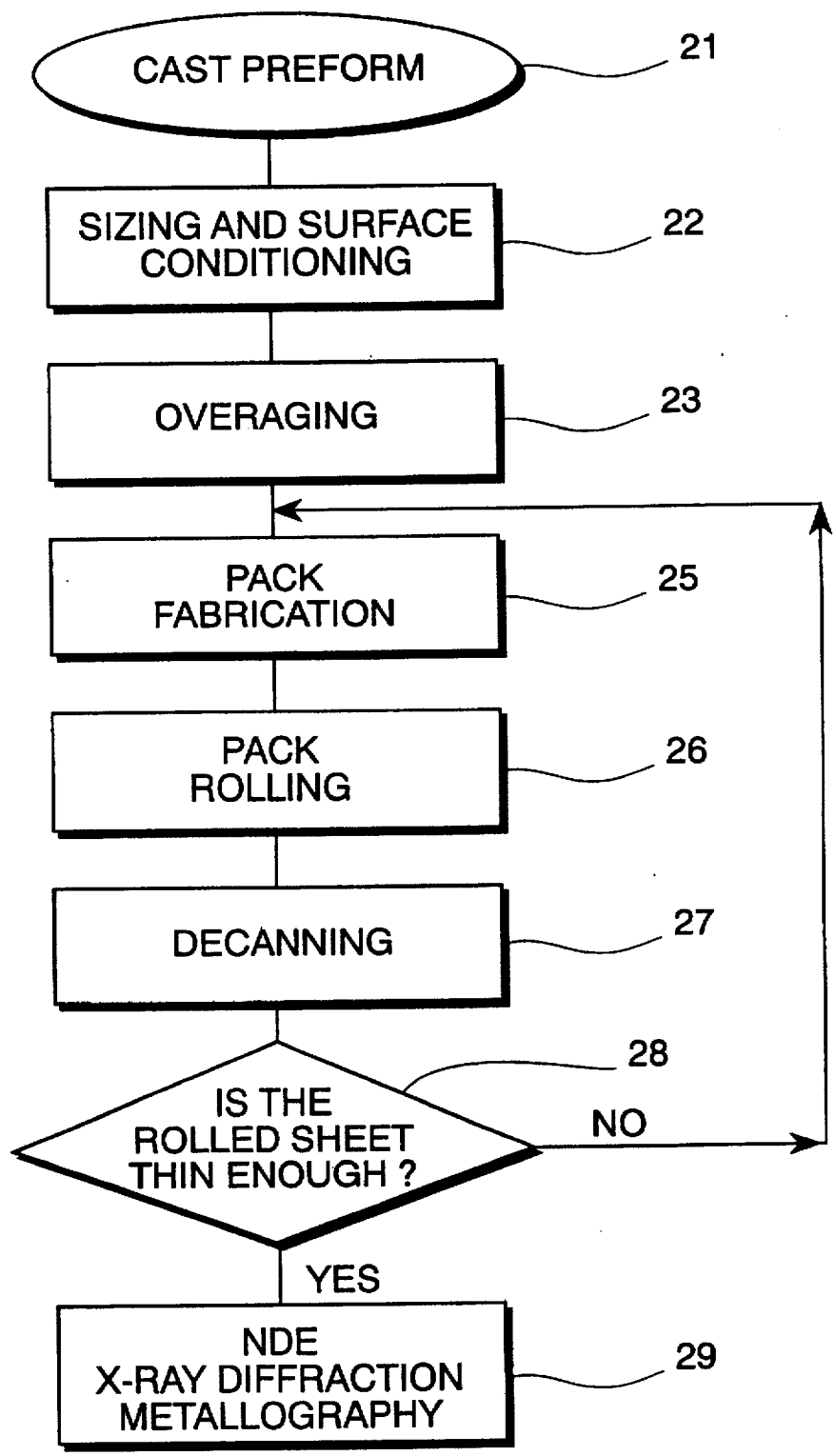
FIG. 2 is a block diagram showing the sequence of process steps for the invention.

Referring now to FIG. 2, shown therein in block diagram form is the sequence of processing steps according to the invention. In accordance with a principal object of the invention, a thick slab of a superalloy single crystal casting (usually about 110×75×14 mm) is rolled into thin (0.05 mm) single crystal sheet without the occurrence of recrystallization or cracking in the as-rolled sheet. A single crystal cast preform 21 of a superalloy is first suitably sized (to about 110×38×14 mm) and surface conditioned as at 22. Because the deformation resistance of the as-cast single crystal superalloy is high, preform 21 is first overaged by heat treatment in vacuum as at 23. Fracture during rolling is avoided by selection of a heating temperature within the narrow temperature windows below the γ′ solvus temperature of the alloy. In the directionally solidified state, single crystal superalloys generally contain 40–70% of the γ′ phase. The amount, size, and morphology of this phase exert a profound influence on the deformation resistance and fracture behavior of the alloy during hot working. Deformation resistance of γ′ strengthened superalloys is reduced by effectively increasing γ′ particle size without altering its volume fraction by heating the alloy and soaking at temperatures just below the γ′ solvus and cooling the alloy gradually through the γ′ precipitation regime. This procedure promotes growth of γ′ particles but avoids additional γ′ nucleation. Typically this step comprises gradual heating (about 10° C./min) of preform 21 to 1270° C. (temperature at which nearly 90–95% of γ′ phase dissolves in the matrix, and will vary somewhat with alloy composition), holding at that temperature for about 1 hour followed by cooling at the rate of 5° C./hour in the temperature range 1270°–1035° C., cooling at the rate of 30° C./hour in the range of 1035°–815° C. and 5° C./minute below 815° C. Cooling at these rates was performed to suppress the additional nucleation of γ′ phase particles and to enable growth of existing γ′ phase particles, thereby permitting an increase in the amount of γ′ phase, and to accomplish the overaging of γ′ phase particles. After the overaging treatment, the microstructure of the alloy consists of γ′ phase particles with a mean particle size of about 5 μm. While the temperatures presented herein are specifically applicable to PWA 1480 alloy, heat treatment/ deformation temperatures for other related compositions may be selected by one skilled in the art guided by the representative processing parameters presented in these teachings.

The overaged preform 21 is then cut to size and the top and bottom surfaces are ground flat (with adequate coolant) to eliminate surface flaws; the lateral surfaces are ground to ensure perpendicularity to the top and bottom surfaces; and the preform is then inspected by conventional non-destructive inspection techniques for absence of surface and internal defects.

Figure 3:
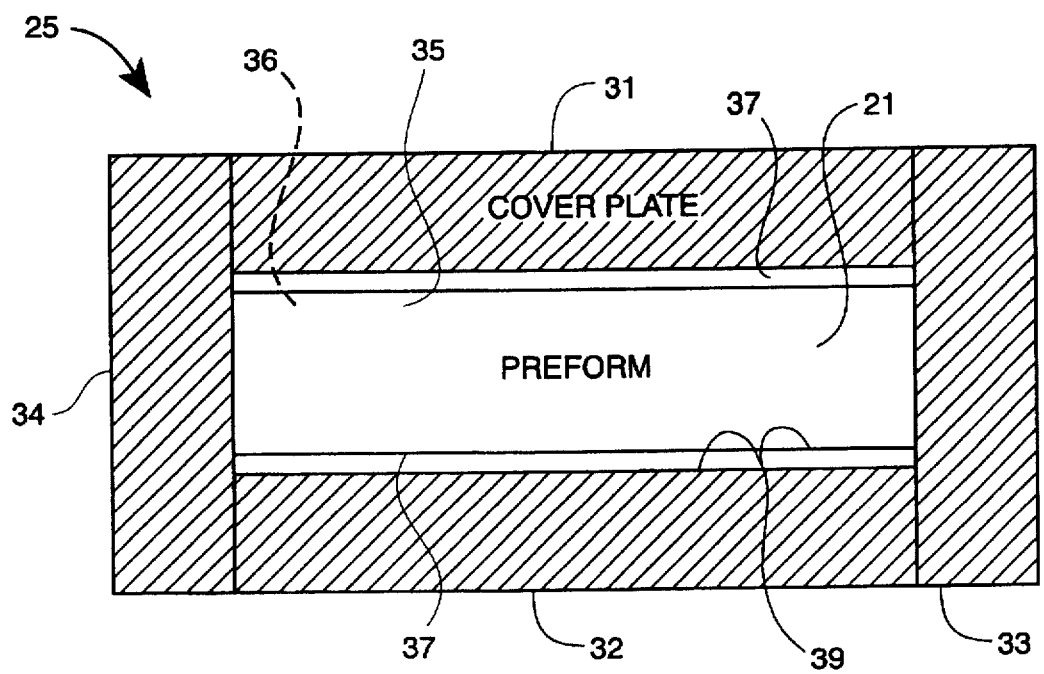
FIG. 3 is a sectional view of a pack assembly structure useful in pack rolling an alloy in the practice of the method of the invention.

Preform 21 may then be rolled in successive rollings at temperatures, roll speeds and percent reductions as hereinafter described to avoid cracking and occurrence of recrystallization in the alloy. Rolling of the alloy may preferably be accomplished by inserting preform between plates of high temperature resistant metal or alloy plates. Accordingly, and with reference now additionally to FIG. 3, pack assembly 25 is then fabricated by applying cover plates 31,32, side plates 33,34 and front and rear plates 35,36 to preform 21. Plates 31–36 are generally about 3 to 10 mm in thickness, sized to enclose preform 21, and comprise any suitable high temperature alloy material as would occur to the skilled artisan practicing the invention, such as the series of Inconel® alloys, austentic stainless steels, Hastelloy®, Nimonic alloys, cobalt base alloys such as Haynes 188 or L 605, and nickel-iron base superalloys such as A 286, Incoloy 901, or Inconel 718. Optional interlayers 37 of thin foils of refractory metals such as tantalum or molybdenum or their alloys, nickel base alloys or stainless steel, may be interposed in the pack 25 assembly between top cover plate 31 and preform 21 and between bottom cover plate 32 and preform 21. Parting (insulating) agents comprising a high temperature stable oxide such as $Al_2O_3$, CaO, MgO, $Y_2O_3$, or any other suitable commercially available agent is applied as a coating 39 on each internal interface of pack 25. Judicious choice of interlayers and parting agent will optimize heat flow within pack 25. Plates 31–36 are then assembled together with an evacuation tube and welded using appropriate welding process, suitable filler materials and good fit-up to prevent distortion. The welded pack 25 assembly is evacuated, leak checked and sealed. Handling tabs (not shown) of any suitable material (such as 304 stainless steel) are attached to facilitate pack 25 handling during transfer and rolling.

Welded pack 25 is then pre-heated in an intermediate temperature range typically 900°–950° C. for about 1 hour in order to reduce the temperature transients and thermal stresses in the pack and to minimize the time at the soaking temperature; pack 25 is then transferred to a soaking furnace at a temperature in the range or 1093°–1150° C., which temperature range represents a desirable compromise between requirements for reducing the deformation resistance and cracking tendencies in the alloy and for suppressing the onset of both dynamic and static recrystallization in the alloy. Temperature stability of the furnace is maintained at about +5° C. or better in order to ensure uniform and reproducible temperature distribution on the surface of the pack, which in turn reduces the tendency toward recrystallization or cracking. After soaking for about one-half hour to two hours, pack 25 is rolled in a rolling mill (such as a 2-, 3- or 4-high mill, depending on pack 25 thickness), as at 26 in FIG. 2. Pack 25 may be robed along any crystallographic direction of preform 21, preselected in the casting and growth of preform 21, depending on the intended geometry or use of the as-rolled sheet. Though a wide range of roll speeds can be used, depending on the selected rolling mill, composition of preform 21 and other processing factors, rolling speeds of 0.12–0.25 m/s corresponding to strain rate of about 1–2 $s^{-1}$ yield optimum results. The reduction per pass is generally about 5–15% (preferably about 10%). The pack is generally reheated for about 3–5 minutes at the soaking temperature between successive passes. Rolling is continued to a total thickness reduction of about 50–75%. Any onset of weld cracking or preform 21 cracking can be detected by direct inspection of pack 25 between successive passes or by referring to load-time charts recorded during rolling. After rolling is complete, pack 25 is returned to the furnace, soaked for short periods, typically 2–10 minutes, to reduce or eliminate residual stresses in the pack/preform, and to decrease the dislocation density in the sheet without permitting recrystallization to set in; and then cooled slowly. The rolled pack is then carefully decanned (27 in FIG. 2) to recover rolled preform 21, which is inspected, conditioned, repacked and rolled again (28) to the desired final thickness, typically 0.50–0.75 mm. In general, several packing and rolling campaigns are required to roll thick (typically 12–25 mm) slabs of alloy to a thickness of about 0.5 mm thickness. The rolled sheet is then inspected (as at 29 in FIG. 2) by conventional non-destructive methods (such as x-ray radiography, ultrasonic imaging and dye-penetrant) to detect internal and surface flaws. Specimens may be taken from pack 25 or the as-rolled sheet at various stages of the process for metallographic and x-ray diffraction inspection.

Figure 4A:
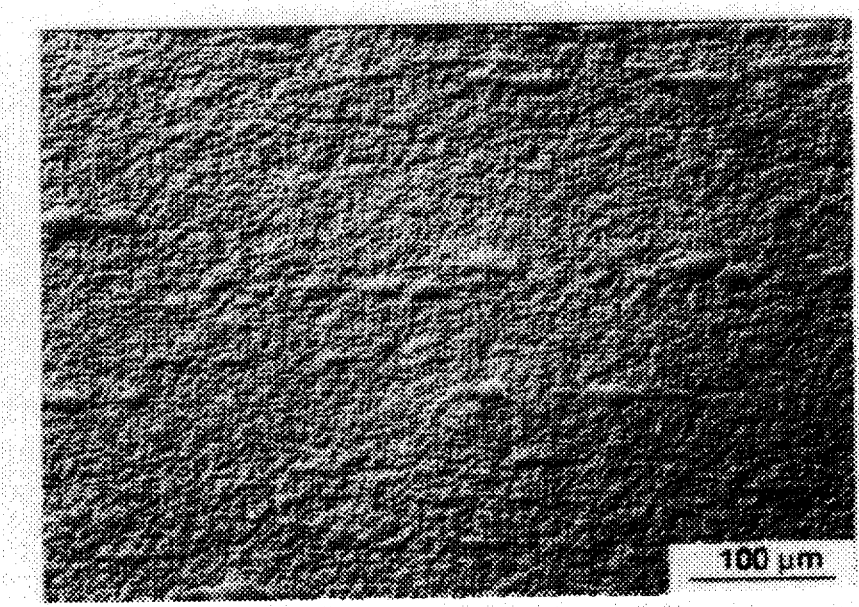
FIGS. 4a and 4b are photomicrographs of microstructures of a PWA 1480 alloy after final stage rolling according to the invention.
Figure 4B:
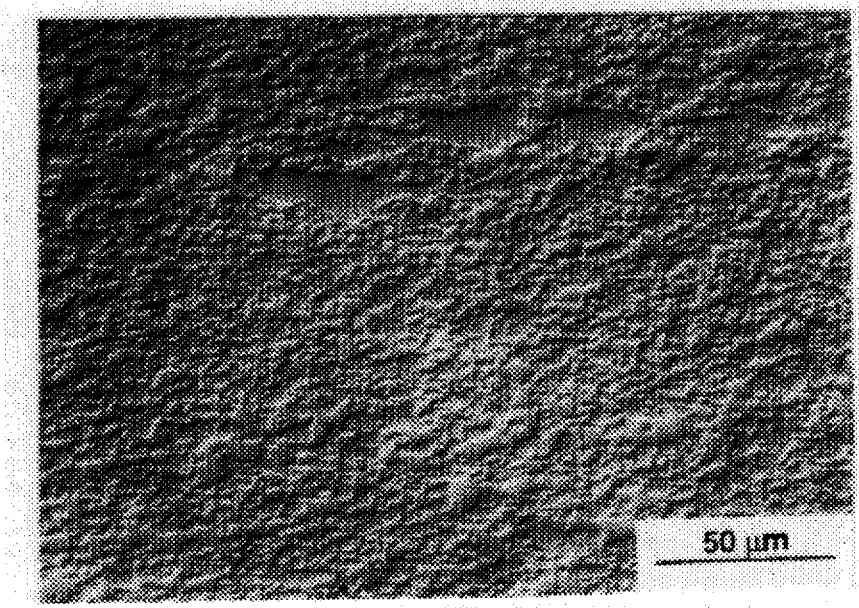

In demonstration of the method of the invention as just described, sample castings of the nickel base alloy PWA 1480 were rolled, the results being presented in TABLE I. The resultant as-rolled sheets were free of polycrystalline aggregates. Referring now to FIG. 4, it is seen that the microstructures of as-rolled specimens revealed γ′ precipitates belonging to two different size distributions, one group corresponding to the initial overaged state, modified by thermal exposure during rolling as shown in FIG. 4a, and the second group corresponding to the precipitates formed during air cooling after the final soaking heat treatment as shown in FIG. 4b.

Although the invention was demonstrated on PWA 1480 nickel based superalloy, the process is likewise applicable to single crystal forms of other well known nickel base superalloys (many of proprietary compositions, including N5, N6, N7, NASAIR 100, PWA 1484, CMSX2, CMSX4, CMSX6, SRR 99, MXON and Alloy 454, and utilizing a preform grown along any crystallographic orientations.

The invention, therefore, provides a method for hot rolling a single crystal nickel base superalloys to single crystal thin sheet form without the occurrence of recrystallization or cracking in the rolled sheet. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or the scope of the appended claims.

TABLE I

| Soak Temp (°C.) | % Reduction Per Pass | Pack Thickness (mm) | | | Preform Thickness (mm) | | |
|---|---|---|---|---|---|---|---|
| | | Init | Final | Reduction | Init | Final | Reduction |
| 1093 | 5 | N/A | N/A | N/A (1) | 14.43 | 11.46 | 20.6% |
| 1121 | 6 | 31.75 | 13.08 | 58.8% (2) | 14.22 | 9.91 | 30.3% |
| 1149 | 10 | 23.37 | 8.13 | 65.2% (3) | 9.65 | 3.35 | 65.3% |
| 1149 | 10 | 24.38 | 5.00 | 74.5% (3) | 9.86 | 2.34 | 76.3% |
| 1149 | 10 | 23.62 | 7.37 | 68.8% (3) | 10.11 | 3.43 | 66.1% |
| 1149 | 10 | 16.43 | 3.56 | 78.4% (3) | 2.36 | 0.50 | 78.8% |
| 1149 | 10 | 16.43 | 4.70 | 71.4% (3) | 2.29 | 0.65 | 71.6% |
| 1149 | 10 | 16.89 | 2.92 | 82.7% (3) | 3.30 | 0.61 | 81.5% |
| 1149 | 10 | 17.02 | 2.97 | 82.5% (3) | 3.38 | 0.66 | 80.5% |
| 1149 | 10 | 17.12 | 2.82 | 83.5% (3) | 3.53 | 0.64 | 81.9% |
| 1149 | 10 | 17.07 | 2.85 | 83.3% (3) | 3.56 | 0.64 | 82.0% |
| 1121 | 10 | 28.14 | 7.11 | 74.7% (3) | 14.22 | 3.86 | 72.9% |
| 1121 | 10 | 28.04 | 7.16 | 74.5% (3) | 14.10 | 3.78 | 73.2% |

(1) No pack was used.
(2) 304 SS pack material.
(3) Hastelloy X pack material.

We claim:

1. A method for producing a thin sheet of nickel base superalloy single crystal, comprising the steps of:

(a) providing a cast single crystal preform of a nickel base superalloy;

(b) grinding the surfaces of said preform to remove surface defects;

(c) enclosing said preform within plates of high temperature resistant alloy and applying parting agent coatings to the interfaces of said plates and preform;

(d) welding said plates to form an enclosure for said preform and evacuating said enclosure;

(e) successively heating said preform to about 1093° to 1150° C. for one hour and rolling said preform at roll speeds of about 0.12 to 0.25 m/s at about 5 to 15% reduction per said rolling to form a successively rolled preform having a total reduction in thickness of about 50 to 75%;

(f) removing said plates from said rolled preform, and successively repeating steps (c) through (e) for said rolled preform to form a thin sheet of said alloy having a preselected reduced thickness; and (g) slowly cooling said thin sheet.

2. The method of claim 1 further comprising following step (b), the step of heating said preform in vacuum at a temperature just below the γ' solvus temperature of said alloy and controlled cooling to about room temperature in order to provide an overaged γ' microstructure in said preform.

3. The method of claim 1 further comprising, prior to the step of enclosing said preform within plates of high temperature resistant alloy, the step of inserting layers of refractory metal or alloy between said plates and preform and applying parting agent coatings to said layers.

4. The method of claim 3 wherein said layers comprise thin foils of tantalum, tantalum alloy, molybdenum, molybdenum alloy, nickel base alloy or stainless steel.

5. The method of claim 1 wherein said parting agent comprises a high temperature stable oxide selected from the group consisting of $Al_2O_3$, CaO, MgO, and $Y_2O_3$.

6. The method of claim 1 wherein the step of rolling said preform is performed at a reduction per said rolling of about 10%.

* * * * *